United States Patent
Tomanek et al.

(10) Patent No.: US 9,564,606 B2
(45) Date of Patent: Feb. 7, 2017

(54) ASSEMBLY OF VERTICALLY ALIGNED NANOTUBE ARRAYS CONTAINING PARTICLES AND APPLICATION THEREOF

(71) Applicant: Huawei Technologies Co., Ltd., Shenzhen (CN)

(72) Inventors: David Tomanek, Okemos, MI (US); Wei Han, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 14/978,962

(22) Filed: Dec. 22, 2015

(65) Prior Publication Data

US 2016/0126482 A1    May 5, 2016

Related U.S. Application Data

(63) Continuation of application No. PCT/CN2014/083480, filed on Jul. 31, 2014.

(51) Int. Cl.
*H01L 29/06* (2006.01)
*H01L 21/02* (2006.01)
(Continued)

(52) U.S. Cl.
CPC ......... *H01L 51/0591* (2013.01); *G11C 13/025* (2013.01); *H01L 27/281* (2013.01);
(Continued)

(58) Field of Classification Search
CPC .................... H01L 21/02601; H01L 21/02606; H01L 29/0665; H01L 29/0669; H01L 29/413; H01L 51/0045; H01L 51/0048; H01L 51/057
See application file for complete search history.

(56) References Cited

U.S. PATENT DOCUMENTS

| 6,473,351 B2 | 10/2002 | Tomanek et al. |
| 8,130,569 B1 | 3/2012 | Zettl |

(Continued)

FOREIGN PATENT DOCUMENTS

JP    2005056534 A    3/2005

OTHER PUBLICATIONS

Foreign Communication From a Counterpart Application, European Application No. 14892881.5, Extended European Search Report dated Jun. 22, 2016, 10 pages.
(Continued)

*Primary Examiner* — Hoai V Pham
(74) *Attorney, Agent, or Firm* — Conley Rose, P.C.

(57) ABSTRACT

A nanotube assembly including a nanotube layer, a first layer and a second layer. The nanotube layer comprises a vertically aligned nanotube array. The nanotube array includes a plurality of nanotubes. The first layer of a first conductive material is disposed on one surface of the nanotube layer. The second layer of a second conductive material is disposed on an opposite surface of the nanotube layer. The nanotube of the nanotube layer includes a first end against the first layer and a second end against the second layer. The resistance from the first end to the first layer is lower than a resistance from the second end to the second layer. One or more nano-particles are placed within the nanotube. At least one of the nano-particles is electrically charged, and can move along the nanotube under influence of an electric field.

22 Claims, 8 Drawing Sheets

(51) Int. Cl.
*H01L 51/05* (2006.01)
*G11C 13/02* (2006.01)
*H01L 27/28* (2006.01)
*H01L 51/00* (2006.01)
*B82Y 10/00* (2011.01)
*B82Y 40/00* (2011.01)

(52) U.S. Cl.
CPC ...... *H01L 51/0023* (2013.01); *H01L 51/0048* (2013.01); *B82Y 10/00* (2013.01); *B82Y 40/00* (2013.01); *G11C 2213/16* (2013.01); *Y10S 977/743* (2013.01); *Y10S 977/848* (2013.01); *Y10S 977/943* (2013.01)

(56) References Cited

U.S. PATENT DOCUMENTS

| | | |
|---|---|---|
| 2001/0026468 A1 | 10/2001 | Tanikawa |
| 2007/0192911 A1 | 8/2007 | Xin et al. |
| 2009/0001421 A1* | 1/2009 | Tombler, Jr. ........... B82Y 10/00 257/192 |

OTHER PUBLICATIONS

Kwon, Y., et al., "Bucky Shuttle" Memory Device: Synthetic Approach and Molecular Dynamics Simulations, Physical Review Letter, vol. 82, No. 7, Feb. 15, 1999, 4 pages.
Foreign Communication From a Counterpart Application, PCT Application No. PCT/CN2014/083480, English Translation of International Search Report dated Dec. 5, 2014, 7 pages.
Foreign Communication From a Counterpart Application, PCT Application No. PCT/CN2014/083480, English Translation of Written Opinion dated Dec. 5, 2014, 4 pages.

* cited by examiner

ASSEMBLY OF VERTICALLY ALIGNED NANOTUBE ARRAYS CONTAINING PARTICLES AND APPLICATION THEREOF

CROSS-REFERENCE TO RELATED APPLICATIONS

This application is a continuation of International Application No. PCT/CN2014/083480, filed on Jul. 31, 2014, which is hereby incorporated by reference in its entirety.

TECHNICAL FIELD

The present application generally relates to nanotube technologies, and more particularly to an assembly of nanotube arrays.

BACKGROUND

Although the benefits of nanotube material-based devices are well known, currently it is still difficult to manufacture reliable and practical devices with nanotube arrays for information storage. Moreover, even though it is well known that different states, such as those representing a "bit 0" and a "bit 1", can be associated with different positions of charged nano-particles within a nanotube, it is difficult to detect the positions of the nano-particles inside the nanotube without disturbing the positions. In other words, it is technically difficult, if not impossible, to read binary data consisting of "bit 0" or "bit 1" stored in a nanotube array by detecting the positions of the nano-particles within the nanotube array without changing the positions of the nano-particles.

SUMMARY

Technical solutions are proposed herein through various embodiments for reducing the core dump file transferring time and/or bandwidth during a remote debugging process, and improving the efficiency of the debugging process.

According to a first aspect, a nanotube assembly is provided. The nanotube assembly comprises: a nanotube layer comprising vertically aligned nanotube array, wherein the nanotube array comprises a plurality of nanotubes; a first layer of a first conductive material disposed on one surface of the nanotube layer; and a second layer of a second conductive material disposed on an opposite surface of the nanotube layer, wherein a nanotube of the nanotube layer comprises a first end against the first layer and a second end against the second layer, and a resistance from the first end to the first layer is lower than a resistance from the second end to the second layer; and wherein one or more nanoparticles are placed within the nanotube, at least one of the nano-particles is electrically charged, and capable of moving along the nanotube under influence of an electric field.

In a first possible implementation form of the nanotube assembly according to the first aspect, the second end is degraded.

In a second possible implementation form of the nanotube assembly according to the first implementation form of the first aspect, the second end is trimmed.

In a third possible implementation form of the nanotube assembly according to the first implementation form of the first aspect, the second end has defects in an atomic scale.

In a fourth possible implementation form of the nanotube assembly according to the first implementation form of the first aspect, the second end is siliconized.

In a fifth possible implementation form of the nanotube assembly according to the first aspect as such or according to any of the preceding implementation forms of the first aspect, the first conductive material comprises a plurality of catalyst particles.

In a sixth possible implementation form of the nanotube assembly according to the first aspect as such or according to any of the preceding implementation forms of the first aspect, the nanotubes are divided into a plurality of sub-arrays, each of the sub-array comprises a group of the nanotubes, wherein a pattern of the first layer and a pattern of the second layer overlap at a plurality of units, and wherein each sub-array is on one of the units.

In a seventh possible implementation form of the nanotube assembly according to the sixth implementation form of the first aspect, patterns of the first and second layers comprise a plurality of non-intersecting lines and a width of each of the non-intersecting lines exceeds a diameter of a nanotube of the array.

In an eighth possible implementation form of the nanotube assembly according to the first aspect as such or according to any of the preceding implementation forms of the first aspect, the nanotube assembly is compatible with complementary metal oxide semiconductor (CMOS) process.

In a ninth possible implementation form of the nanotube assembly according to the first aspect as such or according to any of the preceding implementation forms of the first aspect, the nano-particles are fullerene molecules or metall-fullerene molecules.

According to a second aspect, a process for manufacturing a nanotube assembly is provided. The process comprises: forming a first layer of a first conductive material; forming a nanotube layer of vertically aligned nanotube array on the first layer, wherein the vertically aligned nanotube array comprises a plurality of nanotubes, and a nanotube of the nanotube layer comprises a first end against the first layer and a second end; introducing one or more nano-particles within the nanotube, at least one of the nano-particles is charged, and capable of moving along the nanotube under influence of an electric field; and forming a second layer of a second conductive material on the nanotube layer, wherein the second end is against the second layer, wherein a resistance from the first end to the first layer is controlled to be substantially different from a resistance from the second end to the second layer.

In a first possible implementation form of the process according to the second aspect, the process further comprises degrading one end of the first end and the second end to increase a resistance from the end to a layer the end is against of the first layer and the second layer.

In a second possible implementation form of the process according to the first implementation form of the second aspect, degrading one end of the first end and the second end comprises trimming the end.

In a third possible implementation form of the process according to the first implementation form of the second aspect, degrading one end of the first end and the second end comprises creating defects in an atomic scale at the end.

In a fourth possible implementation form of the process according to the first implementation form of the second aspect, degrading one end of the first end and the second end comprises siliconizing the end.

In a fifth possible implementation form of the process according to the second aspect as such or according to any of the preceding implementation forms of the second aspect, the first conductive material comprises a plurality of catalyst particles.

In a sixth possible implementation form of the process according to the second aspect as such or according to any of the preceding implementation forms of the second aspect, a pattern of the first layer and a pattern of the second layer overlap at a plurality of units, and further comprising: dividing the nanotubes into a plurality of sub-arrays, each of the sub-array comprises a group of the nanotubes; and forming each of the sub-array on one of the units.

In a seventh possible implementation form of the process according to the sixth implementation form of the second aspect, forming a first layer and forming a second layer comprise forming a first pattern of the first layer and a second pattern of the second layer, wherein the first and second pattern comprise a plurality of non-intersecting lines and a width of each of the non-intersecting lines exceeds a diameter of a nanotube of the array.

In an eighth possible implementation form of the process according to the second aspect as such or according to any of the preceding implementation forms of the second aspect, the process is compatible with CMOS process.

In a ninth possible implementation form of the process according to the second aspect as such or according to any of the preceding implementation forms of the second aspect, the nano-particles are fullerene molecules or metallfullerene molecules.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF DRAWINGS

Preferred features of the present disclosure will now be described, by way of non-limiting embodiments, with reference to the accompanying drawings, in which.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DESCRIPTION OF EMBODIMENTS

In order to make the aforementioned objectives, technical solutions and advantages of the present application more comprehensible, a detailed description is provided below. The detailed description sets forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively by a wide range of practical means.

Figure 1:
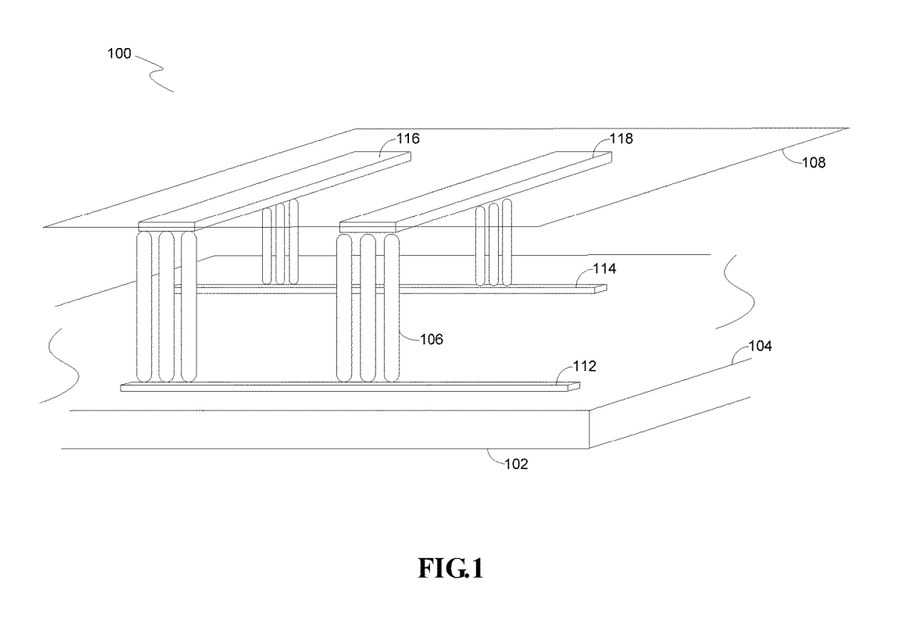
FIG. 1 is a simplified structure diagram of a nanotube assembly, in accordance with an embodiment of the disclosure.

FIG. 1 shows a schematic structure diagram of a nanotube assembly 100, in accordance with one embodiment of the present disclosure. In the example of FIG. 1, the nanotube assembly 100 includes a layer of vertically aligned nanotube array 106, a bottom layer 104 with a bottom pattern including lines 112 and 114, an upper layer 108 with an upper pattern including lines 116 and 118, and optionally a substrate (e.g., a silicon substrate) 102. The vertically aligned nanotube array 106 comprises multiple vertically aligned nanotubles. The bottom layer 104 is a layer of conductive material including, for example, catalyst particles such as iron particles, and is disposed between one surface of the nanotube layer 106 and the substrate 102. The upper layer 108 is a layer of conductive material including, for example, gold, and is disposed on the other surface of the nanotube layer 106.

Figure 2:
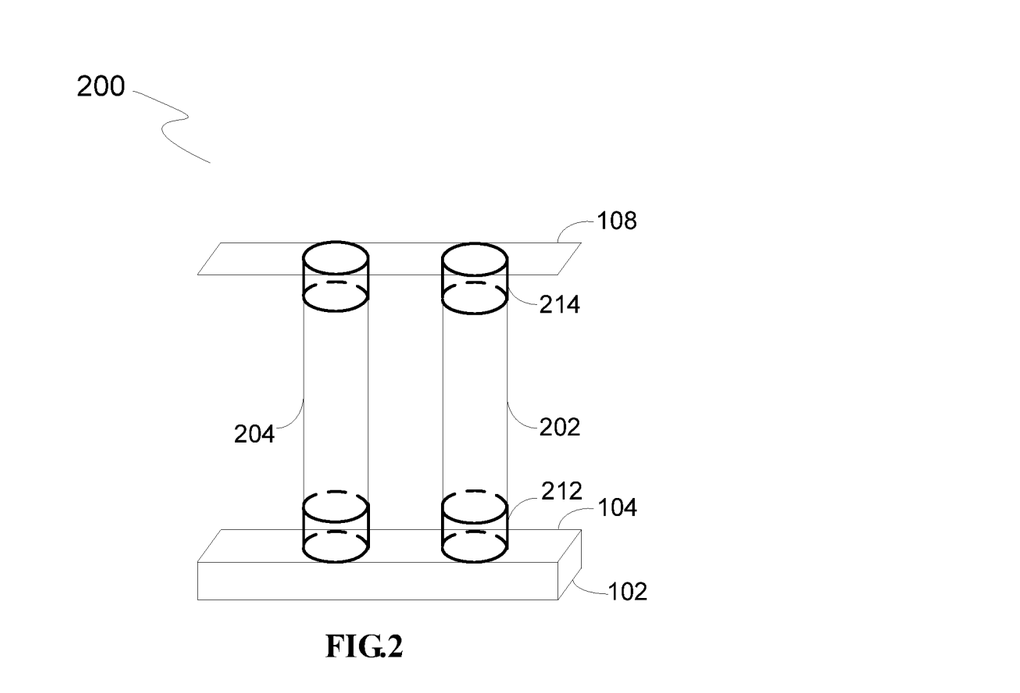
FIG. 2 is an example of a simplified structure of a part of the nanotube assembly, in accordance with an embodiment of the disclosure.

Detailed description about the structure of the nanotube layer 106 is provided herein with FIG. 2. FIG. 2 shows an example of a simplified structure of a part 200 of the nanotube assembly 100, in accordance with one embodiment of the present disclosure. FIG. 2 is described in combination with FIG. 1. Therefore, elements appeared in FIG. 1 is identically labeled in FIG. 2.

In the example of FIG. 2, the nanotube layer 106 is essentially composed of individually-formed nanotubes, such as nanotubes 202 and 204 (dimensions of the nanotubes and distances between the nanotubes are not to scale). The nanotube 202 includes a bottom end 212 (shown as bold lines) against the bottom layer 104, and an upper end 214 (shown as bold lines) against the upper layer 108. For the intended use of the nanotube assembly as set forth in this application, a resistance $R_B$ from the bottom end 212 to the bottom layer 104 should be different from a resistance $R_U$ from the upper end 214 to the upper layer 108. In order to achieve the difference, for example, one of the bottom end 212 and the upper end 214 is degraded (via a chemical or physical process) so that one of the resistance (either $R_B$ or $R_U$) corresponding to the degraded end is increased and thus greater than that of the other end. For example, if the bottom end 212 is degraded, the resistance $R_B$ is greater than the resistance $R_U$. If the upper end 214 is degraded, the resistance $R_U$ is greater than the resistance $R_B$. Ends of the nanotubes can be degraded by one or more of the following means known or not known to person skilled in the art: trimming, thermal degrading, siliconization, introducing defects in an atomic scale, and so on. In one embodiment, an end of a nanotube is slightly trimmed, so that it is separated in a nano scale from the layer the end is against. Thus, the corresponding resistance $R_B$ or $R_U$ is increased. In another embodiment, thermal degrading of the nanotubes can be used, and the thermal degrading is detailed, for example, in the following reference: H. M. Duong, E. Einarsson, J. Okawa, R. Xiang and S. Maruyama, Thermal Degradation of Vertically Aligned Single-Walled Carbon Nanotubes, Jpn. J. Appl. Phys., 2008, 47, 1994.

One or more nano-particles are placed within the nanotube 202, in which at least one of the nano-particles is electrically charged. At least some of the nano-particles inside the nanotube can move along the nanotube 202 under influence of an electric field. In one embodiment, the nano-particles are fullerene molecules or metallofullerene molecules.

The movement of the nano-particles along a nanotube will be described in conjunction with FIG. 3 and FIG. 4.

Figure 3:
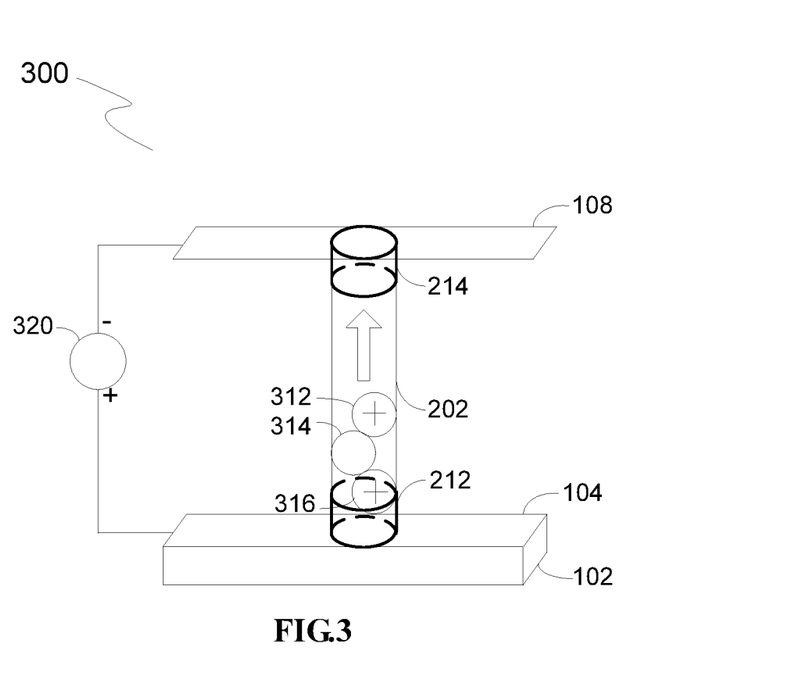
FIG. 3 is an example of a simplified structure of a part of the nanotube assembly with a voltage supply, in accordance with an embodiment of the present disclosure.

In FIG. 3, a voltage supply 320 is connected between the upper layer 108 and the bottom layer 104. The voltage supply 320 supplies an electrical voltage of, e.g., 2 volts (V). A positive terminal of the voltage supply 320 is connected to the bottom layer 104, and a negative terminal of the voltage supply 320 is connected to the upper layer 108. The nanotube 202 contains inside nano-particles 312, 314 and 316, some or all of which are mobile and can move along the direction of the axis of the nanotube 202. Some of the nano-particles, for example nano-particles 312 and 316 are electrically charged, e.g., with positively charged potassium ion $K^+$, and nano-particle 314 is electrically neutral, i.e. not charged. Initially, before applying the electrical voltage, the charged nano-particles 312, 314 and 316 are located at the bottom of the nanotube 202 close to the bottom layer 104. Under the influence of the electric field generated by the voltage supply 320, the charged nano-particles 312 and 316 can move from the bottom of the nanotube 202 to the upper of the nanotube 202.

The non-charged nano-particle 314 may stay at its original location or moved by the charged nano-particles 312 and 316 that are driven by the electric field, depending on the position of the non-charged particle 314 with respect to the positions of the charged nano-particles. As shown in FIG. 3, if the non-charged nano-particle 314 is located between the charged nano-particles 312 and 316, it may be driven by the charged nano-particles 312 and 316. If the non-charged nano-particle 314 is located below the charged nano-particle 312, it may stay at its original position.

Figure 4:
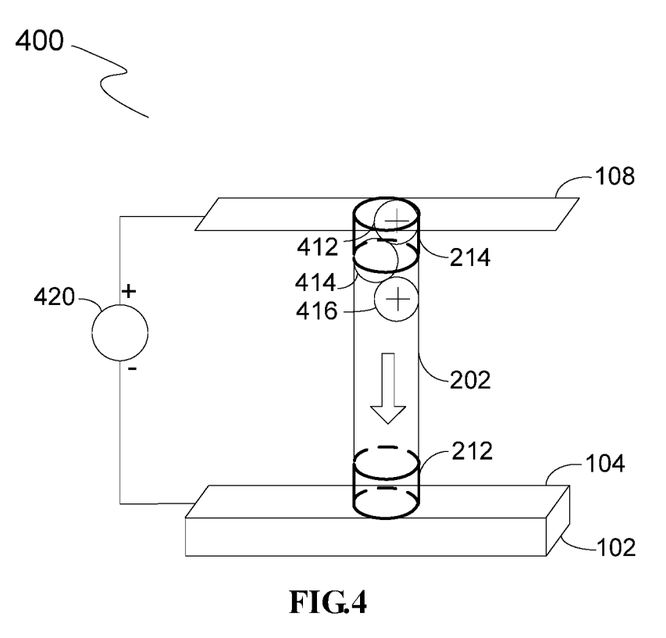
FIG. 4 is another example of a simplified structure of a part of the nanotube assembly with a voltage supply, in accordance with an embodiment of the present disclosure.

In the example of FIG. 4, a voltage supply 420, e.g., with a voltage 2V, is connected between the upper layer 108 and the bottom layer 104. A positive terminal of the voltage supply 420 is connected to the upper layer 108, and a negative terminal of the voltage supply 420 is connected to the bottom layer 104. The nanotube 202 contains nano-particles 412, 414 and 416, all of which are mobile and can move along the nanotube 202. The nano-particles 412 and 416 are charged, e.g., with $K^+$, and the nano-particle 414 is not charged. Initially, the charged nano-particles 412 and 416 are located at the upper of the nanotube 202. Under influence of the electric field generated by the voltage supply 420, the charged nano-particles 412 and 416 can move from the upper of the nanotube 202 to the bottom of the nanotube 202. The movement of the non-charged nano-particle 414 is similar to the movement of the non-charged nano-particle 314 in FIG. 3.

Thus, the positions of the charged nano-particles can be changed by applying a voltage between the upper layer 108 and the bottom layer 104. If the positions where the charged nano-particles are located represent, respectively, a "bit 0" and a "bit 1", and the "bit 0" and "bit 1" are associated with data information, the data information can be changed or rewrote by applying a voltage supply between the upper layer 108 and the bottom layer 104. For example, if the situation that the charged nano-particles are located at the bottom is associated with the "bit 0", the situation that the charged nano-particles are located at the upper is associated with the "bit 1", and the charged nano-particles are located at the bottom initially, by applying a voltage supply between the upper layer 108 and the bottom layer 104 with a negative terminal of the voltage supply applied to the upper layer 108 and a positive terminal of the voltage supply applied to the bottom layer 104, the charged nano-particles can move to the upper and the data stored at the nanotube can be changed from "0" to "1".

Figure 5:
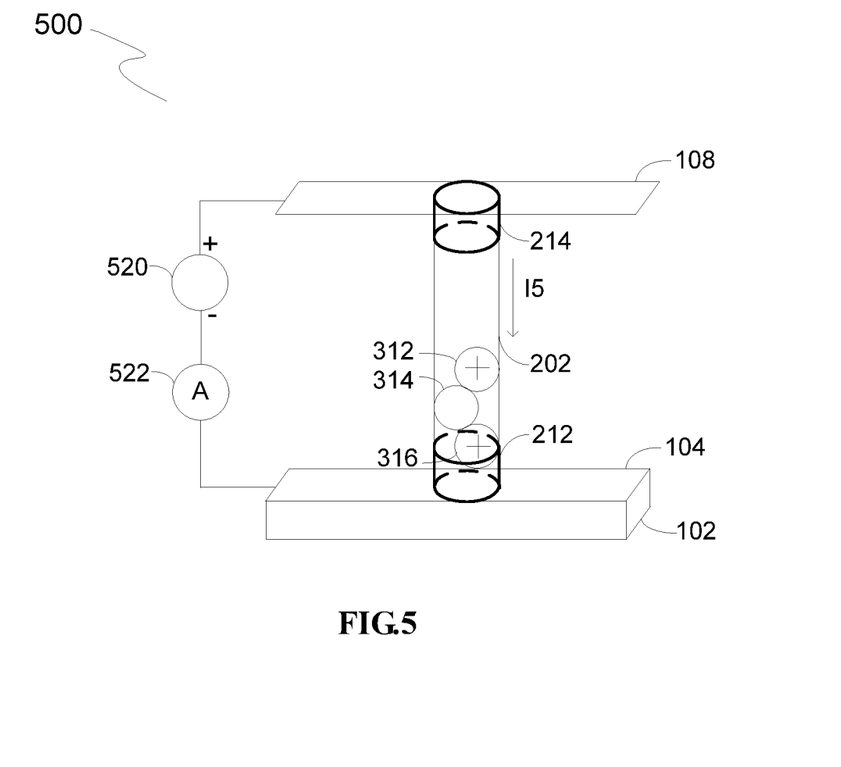
FIG. 5 is an example of a simplified structure of a part of the nanotube of the nanotube assembly with a voltage supply and a current meter, in accordance with an embodiment of the present disclosure.
Figure 6:
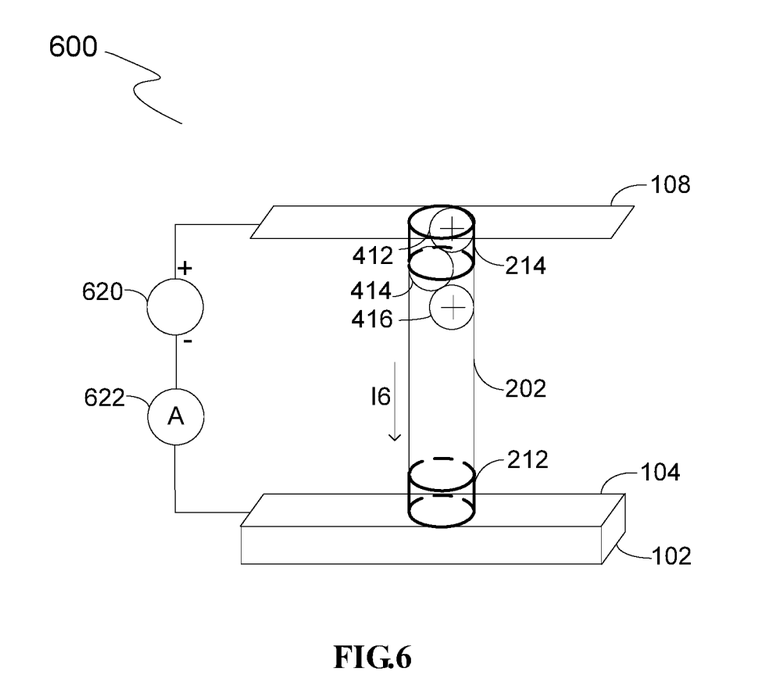
FIG. 6 is another example of a simplified structure of a part of the nanotube of the nanotube assembly with a voltage supply and a current meter, in accordance with an embodiment of the present disclosure.

The reading process of the data information associated with the positions of the charged nano-particles will be detailed with FIG. 5 and FIG. 6.

In the example of FIG. 5, the resistance $R_U$ from the upper end 214 to the upper layer 108 is greater than the resistance $R_B$ from the bottom end 212 to the bottom layer 104. A voltage supply 520 is connected. The voltage of the voltage supply 520 is such that the charged nano-particles 312, 316 cannot move under the influence of the electric fields generated by the voltage supply 520. In the example of FIG. 6, the resistance $R_U$ from the upper end 214 to the upper layer 108 is greater than the resistance $R_B$ from the bottom end 212 to the bottom layer 104. A voltage supply 620 is connected. The voltages of the voltage supply 620 is such that the charged nano-particles 412 and 416 cannot move under the influence of the electric fields generated by the voltage supply 620.

In the example of FIG. 5, the charged nano-particles 312 and 316 are located at the bottom of the nanotube 202. In the example of FIG. 6, the charged nano-particles 412 and 416 are located at the upper of the nanotube 202. Since the charged nano-particles 412 and 416 have smaller resistance than the resistance $R_U$, the total resistance from the upper layer 108 to the bottom layer 104 in the example of FIG. 6 can be lower than the total resistance from the upper layer 108 to the bottom layer 104 in the example of FIG. 5. Thus, a current $I_6$ flowing from the upper layer 108 to the bottom layer 104 as shown in FIG. 6 can be greater than a current $I_5$ flowing from the upper layer 108 to the bottom layer 104 as shown in FIG. 5. The current meter 622 in FIG. 6 and the current meter 522 monitor the current $I_6$ and $I_5$, respectively.

Therefore, the positions of the charged nano-particles can be detected by monitoring the currents flowing through the current meters. In this embodiment, a greater current flowing through the current meter indicates that the charged nano-particles are located at the upper end, while a lower current flowing through the current meter indicates that the charged nano-particles are located at the bottom end. Accordingly, if data information such as "0" and "1" is recorded as corresponding to different positions of the charged nano-particles in the nanotubes, the data information can be read out by using the current meters.

In other words, by applying a voltage supply across the bottom layer against the bottom end of the nanotube and the upper layer against the upper end of the nanotube, and monitoring the current flowing through the nanotube, the positions of the charged nano-particles within the nanotube can be detected. Advantageously, the reading process can detect the positions of the charged nano-particles and thus read out the data information stored in the nanotubes, without changing the positions and data information. Moreover, since the voltage supply applied between the upper layer 108 and the bottom layer 104 while reading are quite small, the reading process consumes a very small amount of power.

In the example of FIG. 1, the nanotubes of the nanotube layer 106 are divided into multiple sub-arrays. Each of the sub-array includes a group of nanotubes. From a larger scale, it can be seen that the bottom layer 104 and the upper layer 108 may be formed with patterns. For example, the pattern of the bottom layer 104 and the pattern of the upper layer 108 may be different, and they may vertically overlap. An area overlapped by the pattern of the bottom layer 104 and the pattern of the upper layer 108 is such that part of the nanotube array is sandwiched between the conductive materials of the bottom layer 104 and the upper layer 108. The nanotube arrays in such areas are regarded as sub-arrays, and each sub-array is a unit for storing data information. In one embodiment, the patterns of the bottom layer 104 and the upper layer 108 include multiple non-intersecting lines and a width of each of the non-intersecting lines exceeds a diameter of a nanotube of the nanotube layer 106, e.g., 1 nanometer (nm). By applying multiple voltage supplies or current meters across different lines of the bottom layer 104 and the upper layer 108, data information, e.g., including multiple "bit 0" and "bit 1", can be recorded or read.

Figure 8:
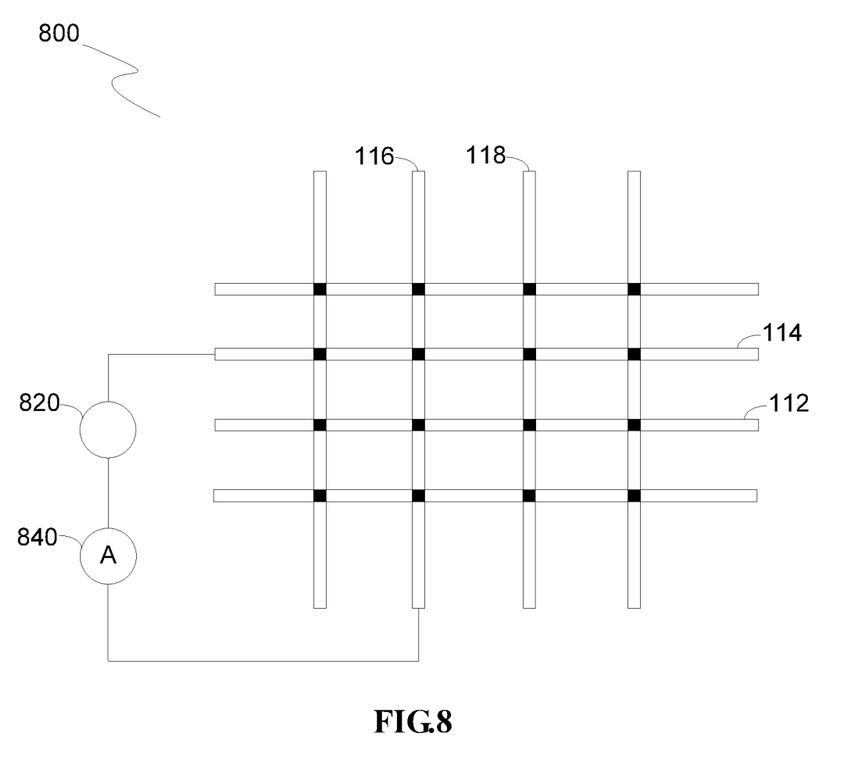
FIG. 8 is a top view of one example of the nanotube assembly, expanded from FIG. 1.

A larger scale view of the nanotube assemble of FIG. 1 is shown in FIG. 8, with an additional voltage supply 820 and an additional current meter 840. Data information stored in the nanotubes on each unit where the lines 112 and 114 vertically overlap the lines 116 and 118 can be read out.

In one embodiment, the nanotube assembly is compatible with CMOS process.

In one embodiment, an information storage device of the above-described nanotube assembly may have a packing density of up to 100 terabyte (TB)/centimeter (cm)$^2$. It may take less than 0.1 nano-seconds and costs power less than $10^{-18}$ joule (J) to write or read information from the nanotube assembly.

Figure 7:
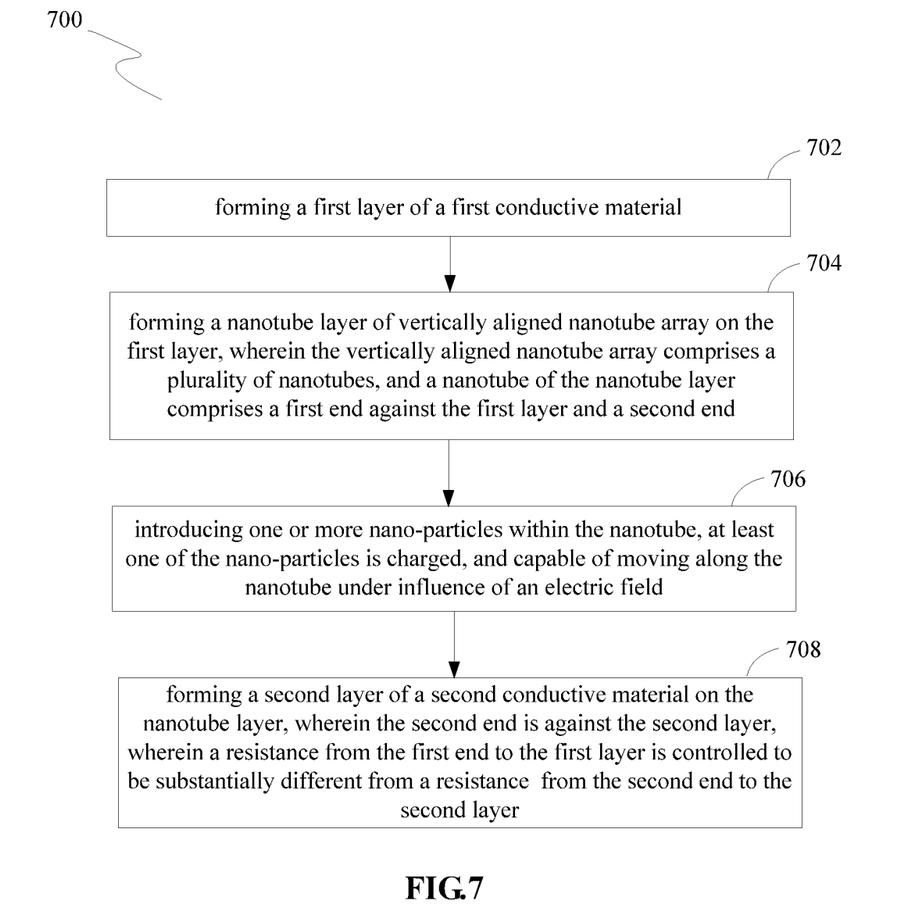
FIG. 7 is an example of a flow chart of a process for manufacturing a nanotube assembly, in accordance with an embodiment of the disclosure.

FIG. 7 shows a flowchart 700 of a method for manufacturing a nanotube assembly, in accordance with one embodiment of the present disclosure. FIG. 7 is described in combination with FIGS. 1-6. Elements labeled the same as in FIGS. 1-6 have similar functions.

At step 702, a bottom layer 104 of a conductive material is formed, for example, on a non-conductive or semiconductive substrate (e.g., a silicon substrate). In one embodiment, the bottom conductive material includes multiple catalyst particles, e.g., iron particles.

At step 704, a layer 106 of vertically aligned nanotube array is formed on the bottom layer 104. The vertically aligned nanotube array includes multiple nanotubes. A typical nanotube 202 of the nanotube layer 106 includes a bottom end 212 against the bottom layer 104 and an upper end 214. Means for forming the vertically aligned nanotube array on a conductive layer are known in the art and are not discussed in detail here.

At step 706, nano-particles, e.g., fullerene molecules or metallfullerene molecules are placed within the nanotubes. In a typical nanotube 202 filled with one or more nano-particles, at least one of the nano-particles is electrically charged, and at least part of the nano-particles inside the nanotube can move along the nanotube under influence of an electric field.

At step 708, an upper layer 108 of a conductive material, e.g., gold, is formed on the nanotube layer 106. The upper end 214 is against the upper layer 108.

In forming the upper layer 108, the resistance from the bottom end 212 to the bottom layer 104 is controlled to be substantially different from a resistance from the upper end 214 to the upper layer 108. The item "substantially different" herein refers to that the difference between the resistance from the bottom end 212 to the bottom layer 104 and the resistance from the upper end 214 to the upper layer 108 is large enough to be detected by conventional or specifically designed electronic equipment.

In one embodiment, the resistance from the bottom end 212 to the bottom layer 104 is increased to be greater than the resistance from the upper end 214 to the upper layer 108. The resistance can be increased, e.g., by degrading the bottom end 212. The bottom end 212 can be degraded in multiple ways, such as trimming the bottom end 212 to separate the bottom end 212 from the bottom layer 104, creating defects in an atomic scale at the bottom end 212, and siliconizing the bottom end 212. In an alternative embodiment, the resistance from the upper end 214 to the upper layer 108 is increased to be greater than the resistance from the bottom end 212 to the bottom layer 104, in a similar way.

In one embodiment, a pattern of the bottom layer 104 and a pattern of the upper layer 108 overlap at multiple units. The nanotubes of the nanotube layer 106 are divided into multiple sub-arrays. Each of the sub-array includes a group of the nanotubes of the nanotube layer 106. In one embodiment, the bottom pattern and the upper pattern include multiple non-intersecting lines. A width of each of the non-intersecting lines exceeds a diameter of a nanotube of the nanotube layer 106.

In one embodiment, the process of manufacturing the nanotube assembly is compatible with CMOS process.

It is noted that the terminology "bottom," "upper," and so on herein are not intended to limit the spatial position or orientation of the nanotube assembly as described herein.

Finally, it should be understood that the above embodiments are only used to explain, but not to limit the technical solution of the present application. Despite the detailed description of the present application with reference to above preferred embodiments, it should be understood that various modifications, changes or equivalent replacements can be made by those skilled in the art without departing from the scope of the present application and covered in the claims of the present application.

What is claimed is:

1. A nanotube assembly, comprising:
    a nanotube layer comprising a vertically aligned nanotube array, wherein the nanotube array comprises a plurality of nanotubes;
    a first layer of a first conductive material disposed on one surface of the nanotube layer; and
    a second layer of a second conductive material disposed on an opposite surface of the nanotube layer,
    wherein a nanotube of the nanotube layer comprises a first end against the first layer and a second end against the second layer,
    wherein a resistance from the first end to the first layer is lower than a resistance from the second end to the second layer, wherein one or more nano-particles are placed within the nanotube, wherein at least one of the nano-particles is electrically charged, and wherein the at least one of the nano-particles is capable of moving along the nanotube under influence of an electric field.

2. The nanotube assembly of claim 1, wherein the second end is degraded.

3. The nanotube assembly of claim 2, wherein the second end is trimmed.

4. The nanotube assembly of claim 2, wherein the second end has defects in an atomic scale.

5. The nanotube assembly of claim 2, wherein the second end is siliconized.

6. The nanotube assembly of claim 1, wherein the first conductive material comprises a plurality of catalyst particles.

7. The nanotube assembly of claim 1, wherein the nanotubes are divided into a plurality of sub-arrays, wherein each of the sub-array comprises a group of the nanotubes, wherein a pattern of the first layer and a pattern of the second layer overlap at a plurality of units, and wherein each sub-array is on one of the units.

8. The nanotube assembly of claim 1, wherein patterns of the first and second layers comprise a plurality of non-intersecting lines, and wherein a width of each of the non-intersecting lines exceeds a diameter of a nanotube of the array.

9. The nanotube assembly of claim 1 is compatible with complementary metal oxide semiconductor (CMOS) process.

10. The nanotube assembly of claim 1, wherein the nano-particles are fullerene molecules.

11. The nanotube assembly of claim 1, wherein the nano-particles are metallfullerene molecules.

12. A process for manufacturing a nanotube assembly, comprising:

forming a first layer of a first conductive material;

forming a nanotube layer of vertically aligned nanotube array on the first layer, wherein the vertically aligned nanotube array comprises a plurality of nanotubes, and wherein a nanotube of the nanotube layer comprises a first end against the first layer and a second end;

introducing one or more nano-particles within the nanotube, wherein at least one of the nano-particles is charged, and wherein the at least one of the nano-particles is capable of moving along the nanotube under influence of an electric field; and forming a second layer of a second conductive material on the nanotube layer, wherein the second end is against the second layer, wherein a resistance from the first end to the first layer is controlled to be substantially different from a resistance from the second end to the second layer.

13. The process of claim 12, further comprising degrading one end of the first end and the second end to increase a resistance from the end to a layer the end is against of the first layer and the second layer.

14. The process of claim 13, wherein degrading one end of the first end and the second end comprises trimming the end.

15. The process of claim 13, wherein degrading one end of the first end and the second end comprises creating defects in an atomic scale at the end.

16. The process of claim 13, wherein degrading one end of the first end and the second end comprises siliconizing the end.

17. The process of claim 12, wherein the first conductive material comprises a plurality of catalyst particles.

18. The process of claim 12, wherein a pattern of the first layer and a pattern of the second layer overlap at a plurality of units, and wherein the process further comprises:

dividing the nanotubes into a plurality of sub-arrays, wherein each of the sub-array comprises a group of the nanotubes; and forming each of the sub-array on one of the units.

19. The process of claim 12, wherein forming a first layer and forming a second layer comprise forming a first pattern of the first layer and a second pattern of the second layer, wherein the first and second pattern comprise a plurality of non-intersecting lines, and wherein a width of each of the non-intersecting lines exceeds a diameter of a nanotube of the array.

20. The process of claim 12 is compatible with complementary metal oxide semiconductor (CMOS) process.

21. The process of claim 12, wherein the nano-particles are fullerene molecules.

22. The process of claim 12, wherein the nano-particles are metallfullerene molecules.

* * * * *